(12) United States Patent
Chan et al.

(10) Patent No.: US 7,679,005 B2
(45) Date of Patent: Mar. 16, 2010

(54) CIRCUITIZED SUBSTRATE WITH SHIELDED SIGNAL LINES AND PLATED-THRU-HOLES AND METHOD OF MAKING SAME, AND ELECTRICAL ASSEMBLY AND INFORMATION HANDLING SYSTEM UTILIZING SAME

(75) Inventors: Benson Chan, Vestal, NY (US); Frank D. Egitto, Binghamton, NY (US); Roy H. Magnuson, Endicott, NY (US); Voya R. Markovich, Endwell, NY (US); David L. Thomas, Endicott, NY (US)

(73) Assignee: Endicott Interconnect Technologies, Inc., Endicott, NY (US)

(*) Notice: Subject to any disclaimer, the term of this patent is extended or adjusted under 35 U.S.C. 154(b) by 1009 days.

(21) Appl. No.: 11/401,401

(22) Filed: Apr. 11, 2006

(65) Prior Publication Data

US 2006/0214010 A1 Sep. 28, 2006

Related U.S. Application Data

(63) Continuation-in-part of application No. 11/086,324, filed on Mar. 23, 2005, now Pat. No. 7,441,709.

(51) Int. Cl.
*H01R 12/04* (2006.01)
*H05K 1/11* (2006.01)
*H01K 3/10* (2006.01)
(52) U.S. Cl. .......................... 174/262; 361/792; 29/852
(58) Field of Classification Search ......... 174/262–266; 361/792–795; 29/830, 846, 852, 853
See application file for complete search history.

(56) References Cited

U.S. PATENT DOCUMENTS

| 5,031,073 | A | 7/1991 | Chang |
| 5,057,798 | A | 10/1991 | Moye et al. |
| 5,196,230 | A | 3/1993 | Okonogi et al. |
| 5,649,160 | A | 7/1997 | Corry et al. |
| 5,684,340 | A | 11/1997 | Soler et al. |
| 6,020,614 | A | 2/2000 | Worley |
| 6,040,524 | A | 3/2000 | Kobayashi et al. |
| 6,429,752 | B1 | 8/2002 | Harju et al. |
| 6,429,757 | B1 | 8/2002 | Karlsson et al. |
| 6,444,922 | B1 | 9/2002 | Kwong |
| 6,495,772 | B2 | 12/2002 | Anstrom et al. |
| 6,518,516 | B2 | 2/2003 | Blackwell et al. |
| 6,522,214 | B1 | 2/2003 | Harju et al. |
| 6,529,229 | B2 | 3/2003 | Nagumo |
| 6,713,685 | B1 | 3/2004 | Cotton |
| 6,832,436 | B2 | 12/2004 | Anstrom et al. |
| 2002/0130739 | A1* | 9/2002 | Cotton ........................ 333/238 |
| 2002/0145571 | A1* | 10/2002 | Hulick et al. ................ 343/872 |
| 2004/0009666 | A1 | 1/2004 | Ishizuki et al. |

* cited by examiner

*Primary Examiner*—Jeremy C Norris
(74) *Attorney, Agent, or Firm*—Mark Levy; Hinman, Howard & Kattell; Lawrence R. Fraley

(57) ABSTRACT

A circuitized substrate in which selected ones of the signal conductors are substantially surrounded by shielding members which shield the conductors during passage of high frequency signals, e.g., to reduce noise. The shielding members may form solid members which lie parallel and/or perpendicular to the signal conductors, and may also be substantially cylindrical in shape to surround a conductive thru-hole which also forms part of the substrate. An electrical assembly and an information handling system are also defined.

20 Claims, 4 Drawing Sheets

CIRCUITIZED SUBSTRATE WITH SHIELDED SIGNAL LINES AND PLATED-THRU-HOLES AND METHOD OF MAKING SAME, AND ELECTRICAL ASSEMBLY AND INFORMATION HANDLING SYSTEM UTILIZING SAME

The present application is a continuation-in-part application of Ser. No. 11/086,324 filed Mar. 23, 2005, now U.S. Pat. No. 7,441,709.

TECHNICAL FIELD

The invention relates to circuitized substrates such as a printed circuit (or wiring) boards (hereinafter also referred to as PCB's), semiconductor chip carriers, or the like, and particularly to such substrates which are adapted for processing high speed (high frequency) signals across various planes thereof. More particularly, the invention relates to providing shielded signal transmission lines within such substrates and larger products utilizing same.

CROSS REFERENCE TO CO-PENDING APPLICATIONS

In Ser. No. 10/740,398, filed Dec. 22, 2003, there is defined a printed circuit board and method of making same in which the board includes a common power plane having dielectric layers on opposing sides thereof and a signal layer on each of said dielectric layers, each signal layer comprising a plurality of substantially parallel signal lines running in substantially similar directions across the signal layers. Predetermined portions of the signal lines in one signal layer are aligned relative to and also parallel to corresponding signal lines in the other signal layer, with the power plane being located between these portions. Through hole connections are provided between selected signal lines in the two layers, these occurring through clearance holes in the power plane so as to be isolated there-from.

In Ser. No. 11/086,324, filed Mar. 23, 2005, there is defined a circuitized substrate in which at least one signal line used therein is shielded by a pair of opposingly positioned ground lines which in turn are electrically coupled to a ground plane located beneath the signal and ground lines and separated there-from by a common interim dielectric layer. An electrical assembly including the circuitized substrate as part thereof and a method of making the circuitized substrate are also included. The substrate may form part of a larger structure such as a PCB, chip carrier or the like.

Both Ser. No. 10/740,398 and Ser. No. 11/086,324 are assigned to the same Assignee as the present invention and are incorporated herein by reference.

BACKGROUND OF THE INVENTION

The need for higher speed circuitries in circuitized substrates such as those used in multilayered printed circuit boards (PCBs), chip carriers, etc. have arisen due to technological advances, in turn giving rise to the need for higher speed digital signal transmissions. If not properly implemented, the reduction in the rise and fall time of high-frequency digital signals propagating within the final product, e.g., a PCB, may lead to a compromise in signal integrity, for example cross-talk noise and signal distortions due to impedance mismatch.

A signal path of a PCB or chip carrier at relatively low frequencies may be represented electrically as a lumped network of series resistances and shunt capacitances. However, as the frequency (speed) is increased, this approach of lumped circuit modeling breaks down, and signal paths must be regarded as transmission lines. The common transmission line structures used, for example, in PCBs, are microstrip, embedded microstrip, stripline and dual striplines. The microstrip configuration simply refers to the case where the conductor is separated from a reference plane, either ground or power, by a dielectric. The stripline configuration, on the other hand, has reference planes above and below the conductor. A typical multilayer PCB of more than two signal layers may have both stripline and microstrip geometries.

The present invention as defined herein is directed at reducing and substantially eliminating cross-talk noise between transmission lines located on conductive layers in a circuitized substrate as well as, significantly, interconnecting conductive thru-holes, such as used in a multilayered PCB or chip carrier by providing effective shielding of the lines and thru-holes. Crosstalk, as is known, is a category of noise induced primarily by the electromagnetic coupling between lines. In multilayered PCBs, especially those of relatively complex construction, crosstalk can occur by the electrical coupling between relatively closely spaced signal traces (lines). Crosstalk decreases noise margins and degrades signal quality. This, of course, can be a major limiting factor in communication systems performance. Crosstalk increases with longer trace coupling distances, smaller separation between traces, shorter pulse rise and fall times, larger magnitude currents or voltages being switched.

Inductive and capacitive coupling are the two known types of signal coupling that are the crosstalk determinant in a multilayered PCB circuit plane. These two types of coupling decrease with increasing distance between source and receiver. Most crosstalk can be attributed to adjacent wires. Because parallel and adjacent wires on a PCB conductive layer interact both capacitively and inductively, the distance over which adjacent wires are parallel needs to be carefully controlled. To minimize crosstalk, some high frequency designs incorporate ground planes under each signal layer, which have proven to virtually eliminate the crosstalk between these layers. Ideally, then, crosstalk between neighboring signals can be reduced by maximizing signal-to-signal spacing and by minimizing signal-to-ground distances. These factors, plus a host of others, contain many interdependencies and are often at odds with one another. For example, high wiring density is required to minimize interconnect delays as well as size, cost and weight. However, as lines are placed closer together, their mutual coupling increases, with a corresponding rise in crosstalk levels.

The design of PCBs, chip carriers and similar structures which include circuitized substructures (e.g., those often referred to as "cores") as part thereof, therefore, has become quite a challenging task, especially when designing high-performance and high-density final products. Most significantly, electromagnetic coupling between the adjacent signal lines (aka traces) is one factor that sets the upper limit to the interconnect density.

In one known multilayered PCB structure, the structure includes a first layer having an electrically conductive plane for electrical connection to a common armature contact of a relay, the electrically conductive plane being sized to substantially cover a mounting footprint of the relay. This PCB structure also includes a second layer parallel to and electrically separate from the first layer, the second layer having an electrically conducting first section for electrical connection to a normally-open contact of the relay and an electrically conducting second section for electrical connection to a normally-closed contact of the relay. The first and said second sections are electrically separate from each other and, in combination with each other, are planar and sized to substantially cover the mounting footprint of the relay.

In U.S. Pat. No. 6,713,685, there is described a method of cutting away material in a PCB so as to form non-circular vias. Laser or plasma ablation is used to remove PCB material about a centerline. This type of material removal allegedly allows lateral movement to create the non-circular patterns. The described resulting shapes for the vias may be circular, square, extended (elongated) and trench-shaped. The trench vias may be micro milled to form a coaxial structure that provides noise suppression and EMI protection, and may be elongated to be much larger than the diameter of a circular micro-via.

In U.S. Pat. No. 6,529,229, first and second clock signal lines are preferably mutually adjacent, and preferably weave around electrode pads and/or wiring patterns used to interconnect the driver ICs. The preferred even-odd variation of the interconnections between the driver integrated circuits (ICs) and the clock signal lines facilitates the mutually adjacent weaving layout of the clock signal lines, which improves their noise immunity. The clock signal lines preferably include in-line electrode pads to which the clock input terminals of the driver ICs are coupled. The in-line electrode pads reduce reflection of the clock signals because they avoid characteristic-impedance discontinuities.

In U.S. Pat. No. 6,444,922, there is described eliminating crosstalk between copper signal lines in a PCB in which a metal shield is formed around each signal trace from the transmit end to the receive end. The metal shield is built from a microstrip or stripline in the PCB by cutting grooves from the surface on both sides of the signal line, through the dielectric material to the underlying ground plane, thereby exposing the ground metal all along the bottom of the channel. The grooves are formed using techniques adapted from microvia technology. Metallization is then applied to the top surface and the grooves (side walls and bottom) resulting in the formation of a complete metal shield around the signal line comparable to that of a coaxial cable. The metal shield isolates the signal from radiating any energy or interference to neighboring signal lines.

In U.S. Pat. No. 5,057,798, there is described the forming of an RF (radio frequency) line on the front and back sides of a ceramic hybrid circuit board containing other components. The RF line is formed on the top side of the circuit board to facilitate connections to other circuit boards and/or RF components, but is routed underneath the board to traverse the areas of the board occupied by other components. When the RF line is on the top side of the substrate, the ground plane is established by the metal layer on the bottom of the substrate; and when the RF line is on the bottom of the substrate, the ground plane is established with the metal layer on top of the substrate. The connection from the topside and backside RF lines is accomplished by low VSWR plated via holes through the substrate. The patent mentions that the grounding mechanisms add matching shunt capacitance, a ground from nearby via openings forms a "quasi coaxial structure" and microstrip line end fringing is possible as a tuning feature.

Coupling semiconductor devices (integrated circuits or chips), including those of the multi-mode variety (analog and digital) onto PCBs, has resulted in various attempts to reduce noise generation and the associated problems. One attempt to solve the noise problem involves the addition of decoupling capacitors placed near the active devices. The decoupling capacitors stabilize the current flowing to these devices. However, while the capacitor absorbs some of the voltage, an undesirable spike still occurs.

Another known attempt to manage switching noise in multi- or mixed-mode structures involves partitioning analog and digital functions. This process requires unique manufacturing processes and custom designs. For example, U.S. Pat. No. 6,020,614 suggests that noise can be reduced by establishing boundary zones between the analog and digital circuits of a semiconductor substrate with the analog circuit having a separate power supply bus from the digital circuit. Further, this patent mentions providing interconnect signal lines such that the isolated wires between the circuits may functionally interact with other circuits while the substrate noise coupling from other circuits remains low. However, spacing the analog components from the digital components can waste precious semiconductor space, which is an important consideration in integrated circuit (and PCB) design.

Yet another attempt to resolve switching noise problems in a multi-mode structure is addressed in U.S. Pat. No. 5,649,160. This patent suggests that the noise can be reduced by shaping the noise from the digital circuit and concentrating it in a single or a small number of parts of the frequency spectrum. This solution relies on the concept that the presence of noise in the analog circuit is less important at certain frequencies, and therefore the spectral peak or peaks from the digital circuit can be carefully placed to result in little or no interference.

Other approaches for arranging transmission lines on microwave circuit structures are described in U.S. Pat. Nos. 6,429,752, 6,429,757 and 6,522,214. And, in U.S. Pat. No. 5,031,073, there is described a PCB in which the board's circuitry is partitioned into a plurality of circuit regions which are selectively isolated with respect to input and output signals. Signal lines in one region are arranged in a closely spaced array aligned with, but spaced from, a corresponding array in an adjacent region. Other shielding structures are described in U.S. Pat. Nos. 5,196,230, 5,684,340 and 6,040,524.

Additional examples of various PCB multilayered structures are shown and described in U.S. Pat. Nos. 6,495,772, 6,518,516 and 6,832,436, in addition to U.S. Published Application US2004/0009666 A1, the teachings of which are incorporated herein by reference, as are the teachings of the other documents cited in this Background.

As defined hereinbelow, the present invention defines a circuitized substrate in which signal conductors adapted for passing high frequency signals are shielded by solid shield members strategically positioned within the substrate's dielectric member relative to the signal conductors. The shield members may be parallel and perpendicular to the signal conductors and may also be of cylindrical configuration to surround the conductive thru-hole(s) which also forms part of the invention. A method of forming the substrate, as well as electrical assemblies and information handling systems using same are also provided. It is believed that such an invention will represent a significant advancement in the art.

OBJECTS AND SUMMARY OF THE INVENTION

It is a primary object of the present invention to enhance the circuitized substrate art.

It is another object of the invention to provide a circuitized substrate which is capable of operating effectively with a minimum of circuit noise, line loss, etc., while still allowing high density wiring patterns, if desired, e.g., to couple electronic packages such as chip carriers thereto if incorporated within a larger structure such as the aforementioned PCBs, chip carriers, etc.

It is another object of the invention to provide a circuitized substrate which can be manufactured and incorporated within larger structures using present technology and at less costs compared to present methods used to manufacture such structures.

According to one aspect of the invention, there is provided a circuitized substrate comprising a dielectric member, a plurality of signal conductors spacedly positioned within the dielectric member, at least one conductive thru-hole within the dielectric member and extending substantially between at least two of the signal conductors, and a plurality of shielding members strategically positioned within the dielectric member so as to substantially entirely surround the plurality of signal conductors including said at least two of the signal conductors between which the conductive thru-hole extends, this plurality of shielding members providing shielding for high frequency signals passing through the signal conductors and conductive thru-hole during operation of the substrate.

According to another aspect of the invention, there is provided a method of making a circuitized substrate which comprises the steps of providing a dielectric member, spacedly positioning a plurality of signal conductors within the dielectric member, forming at least one conductive thru-hole within the dielectric member extending substantially between at least two of the signal conductors, and forming a plurality of shielding members within the dielectric member so as to substantially surround the plurality of signal conductors including the two signal conductors between which the conductive thru-hole extends, this plurality of shielding members providing shielding for high frequency signals passing through the signal conductors and conductive thru-hole during operation of the circuitized substrate.

BEST MODE FOR CARRYING OUT THE INVENTION

Figure 1:
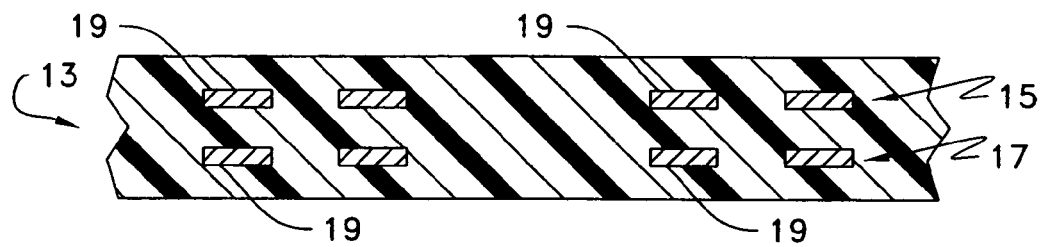
FIGS. 1-9 illustrate the various steps in making a circuitized substrate according to one embodiment of the invention, FIG. 9 also showing one embodiment of a completed substrate adapted for being positioned on another circuitized substrate while also having at least one electrical component positioned thereon.

For a better understanding of the present invention, together with other and further objects, advantages and capabilities thereof, reference is made to the following disclosure and appended claims in connection with the above-described drawings. It is understood that like numerals will be used to indicate like elements from FIG. to FIG.

By the term "circuitized substrate" as used herein is meant to include substrates having at least one (and, preferably, a plurality of) dielectric layer(s) and at least one (and, preferably, a plurality of) electrically conductive layer (s). If more than one of each, the layers are arranged in an alternating manner. Examples of dielectric materials usable for such substrates include fiberglass-reinforced epoxy resins (some referred to as "FR4" dielectric materials in the art, for the flame retardant rating of same), polytetrafluoroethylene (e.g., Teflon), polyimides, polyamides, cyanate resins, photo-imageable materials, and other like materials. Examples of conductor materials usable in such substrates include copper or copper alloys, but may include or comprise additional metals (e.g., nickel, aluminum, etc.) or alloys thereof. Such conductor materials are used to form layers which may serve as power, signal and/or ground layers. If as a signal layer, several conductor lines and/or pads may constitute the layer, while if used as power or ground, such layers will typically be of substantially solid construction. Combinations of both signal and power and/or ground are possible. Examples of circuitized substrates include the aforementioned printed circuit boards (or cards) and chip carriers. It is believed that the teachings of the instant invention may also be applicable to what are known in the art as "flex" (thin) circuits (which use dielectric materials such as polyimide).

Conductive thru-holes are known in the substrate art, and are often referred to as "vias" if internally located (entirely within the substrate's outer confines), "blind vias" if extending a predetermined depth within the substrate from an external surface, or "plated thru-holes" (PTHs) if extending substantially through the substrate's full thickness. By the term "thru-hole" as used herein, therefore, is meant to include all three types of such substrate openings.

As stated above, the term "high speed" as used herein is meant signals of high frequency. Examples of such signal frequencies attainable for the substrates produced in accordance with the teachings herein include those within the range of from about 3.0 to about 10.0 gigabits per second (GPS). These examples are not meant to limit this invention, however, because frequencies outside this range, including those higher, are attainable.

The circuitized substrates defined herein are particularly adapted for use in what can be defined as "information handling systems". By the term "information handling system" as used herein shall mean any instrumentality or aggregate of instrumentalities primarily designed to compute, classify, process, transmit, receive, retrieve, originate, switch, store, display, manifest, measure, detect, record, reproduce, handle or utilize any form of information, intelligence or data for business, scientific, control or other purposes. Examples include personal computers and larger processors such as servers, mainframes, etc. Understandably, the substrates herein are also adaptable for use in other environments and are not limited to such usage.

By the term "electrical component" as used herein is meant components such as semiconductor chips, resistors, capacitors and the like, which are adapted for being positioned on the external conductive surfaces of such substrates as PCBs and chip carriers, and possibly electrically coupled to other components, as well as to each other, using, for example the substrate's internal and/or external circuitry.

By the term "electrical assembly" is meant at least one circuitized substrate as defined herein in combination with at least one electrical component as defined above electrically coupled thereto and forming part of the assembly. Examples of known such assemblies include chip carriers which include a semiconductor chip as the electrical component, the chip usually positioned on the substrate and coupled to wiring (e.g., pads) on the substrate's outer surface or to internal conductors using one or more thru-holes. Perhaps the most well known such assembly is the conventional PCB having several external components such as resistors, capacitors, modules (including one or more chip carriers) etc. mounted thereon and coupled to the internal circuitry of the PCB.

In FIG. 1, a dielectric member 13 is shown, this member including a pair of conductive planes 15 and 17 therein.

Member 13 may be comprised of layers of dielectric material of the types defined above. If two planes are used, member 13 will include three layers, the layers and planes oriented in alternating manner as shown (the dielectric serving to electrically isolate one plane from the other). In one embodiment, each of the three layers may possess a thickness of about two mils (a mil being 0.001 inch). Each plane is preferably a signal plane with a plurality of signal conductors 19 therein. Conductors 19 may be in the form of signal lines which, as shown, project into the drawing. In one example, each line may be about two mils wide and one mil thick. Although eight conductors 19 are shown in two parallel planes 15 and 17, the invention is not so limited because member 13 may include many more planes and conductors, as well as insulating dielectric layers. In the broadest aspects of the invention, member need only comprise one conductive plane of conductors and two opposing dielectric layers.

Figure 2:
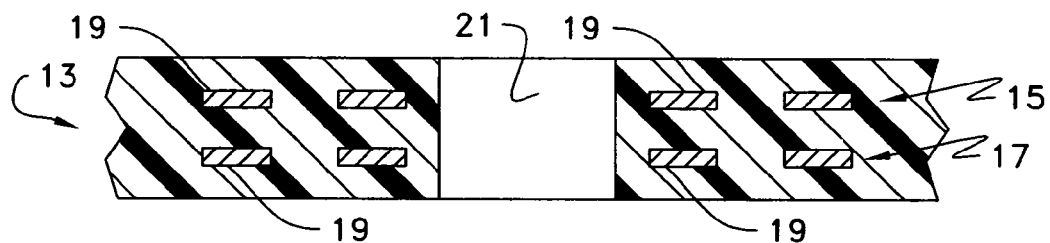

In FIG. 2, an opening 21 is formed within member 13, between opposing pairs of conductors, as shown. Opening 21 may be formed using laser or mechanical drilling, various types of same being known in the art and further description is not considered necessary. In one embodiment, more than one opening may be formed so the invention is not limited to that shown in FIG. 2. In one embodiment, opening may have a diameter of about twelve mils and extend the full thickness of member 13. Opening is understood to be of substantially cylindrical configuration.

Figure 3:
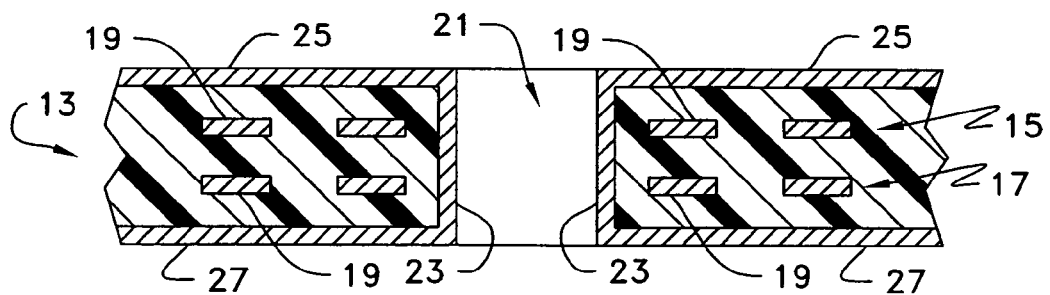

Following opening formation (which may include cleaning of the interior walls of the dielectric member), opening 21 is rendered conductive by applying a metal layer 23 to the opening's interior surfaces and, as shown, to the exterior surfaces of member 13. In one embodiment, layer 23 is copper or an alloy thereof and is applied using electroplating. Either electrolytic or electro-less plating may be used for this plating operation. Such methods are known in the art and further description not deemed necessary. It is within the scope of the invention to provide metals other than copper or copper alloy, as mentioned above. Further, added layers such as nickel and a precious metal such as gold may also be applied, as is also known in the art. In one example, layer 23 possessed a thickness of about one mil. Outer conductive layers 25 and 27, formed simultaneously with layers 23 and of solid construction (e.g., formed from copper foil sheets), may have a corresponding thickness of one mil. As understood from FIG. 3, the solid layers 25 and 27 on the right side thus "blanket" all four conductors 19 located there-between. Significantly, the layer 23 of opening 21 is also of solid configuration and thus forms a solid "wall" immediately to the left of the right-side pair of conductors 19 in this grouping of four. Other conductive openings formed within member 13 will provide similar "walls" at other locations. Layer 23 is also understood to form such a "wall" for the four conductors 19 shown to the left in FIG. 3, which four are also "blanketed" by the solid layer 25 and 27 between which these conductors are oriented. It is also possible to further distant such openings and thus include more than four conductors per grouping.

Figure 4:
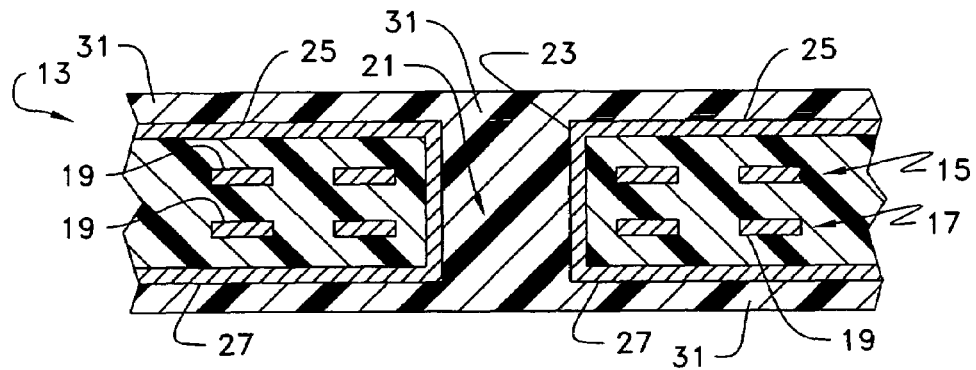

In FIG. 4, member 13 has a quantity of dielectric material 31 bonded thereto, to the extent that material 31 fills opening 21. In one embodiment, material 31 is applied by laminating two layers of such material, each on one of the two opposite sides of member 13, this approach using conventional lamination equipment and process parameters. Material 31 is preferably the same as that used for the layers in member 13, but may be different if desired. Material 31 preferably covers all of the solid conductive layers 25 and 27. As shown, it also covers the interior surfaces of layers 23. In one embodiment, the outer dielectric layers may possess a thickness of about four mils (the actual thickness required for this dielectric material being a function of the dielectric properties of the material and the width of line 49, for impedance control purposes).

Figure 5:
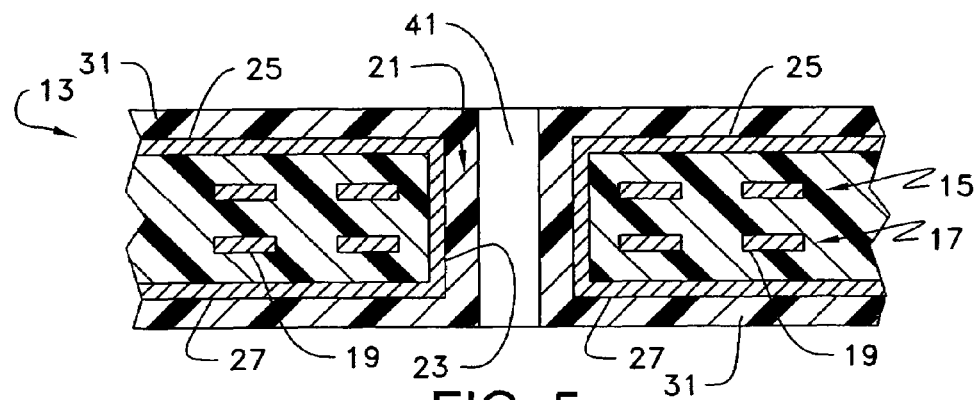

In FIG. 5, an opening 41 is formed, substantially centrally within material 31 (the material having hardened as a result of the lamination), preferably using laser or mechanical drilling as was used for opening 21. In one embodiment, opening 31 may possess a diameter of six mils.

Figure 6:
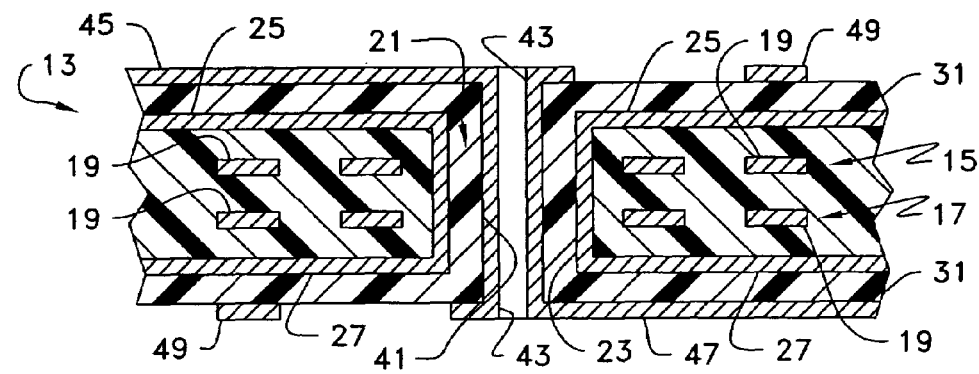

In FIG. 6, opening 41 is rendered conductive in a similar manner, preferably, as that used for opening 21. The result is a layer 43 of copper or copper alloy (and perhaps added metallurgies such as nickel and/or gold) on the interior surfaces of material 31 which define this opening. Similar metallurgy is applied to selected parts of the external surfaces of material 31, in the form of layers 45 and 47, each of substantially solid construction. In one embodiment, layers 45 and 47 can initially cover the entire outer surfaces of material 31, and a specific pattern formed from these using conventional photolithographic processing known in the PCB art. In such a case, separate signal conductors 49 may be formed, each of these preferably in the form of a signal line which extends within the drawing. Conductors 49 may possess a thickness of one mil and a width of six mils. In one embodiment, layer 43 is one mil thick, leaving an internal opening having a diameter of about four mils (the actual dimensions required for the via being a function of the electrical properties of the dielectric material, for impedance control purposes). As shown, this internal opening is also cylindrical and thus coaxially oriented with opening 21, the layers of opening 21 surrounding the internal opening. Opening 41 is thus electrically conductive and forms a thru-hole within member 13. In one embodiment, as many as about one-hundred such thru-holes may be formed as part of the dielectric member, each surrounded by a coaxial, cylindrical layer of metal.

Figure 7:
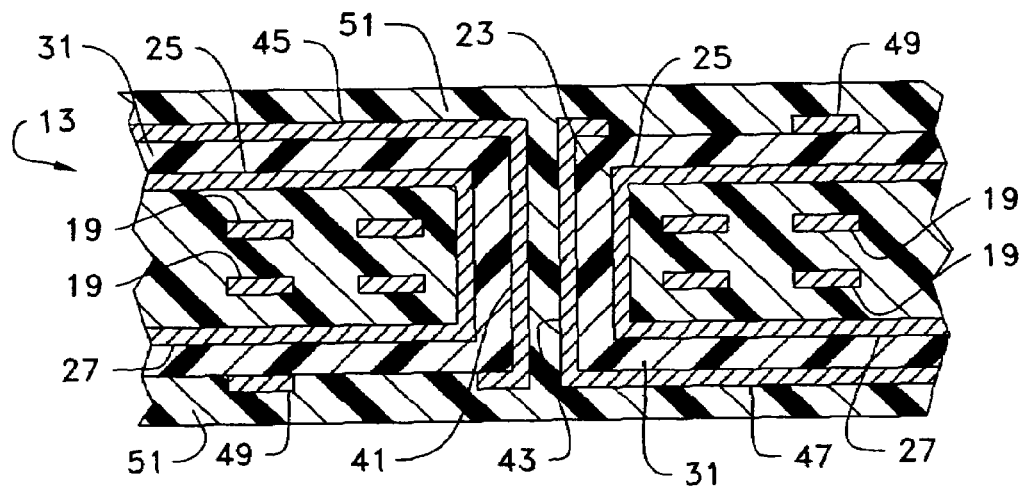

In FIG. 7, a quantity of dielectric material 51, preferably the same as the material of member 13, is provided, to the extent that it forms an outer layer on each of the FIG. 7 structure's outer surfaces, and, significantly, also fills opening 41. Material 51 is also preferably provided initially in the form of two layers which are then laminated onto the structure, similarly to the application of material 31. In one embodiment, the outer layers may each have a thickness of four mils (the actual thickness required for this dielectric material being a function of the width of lie 49, for impedance control purposes.

Figure 8:
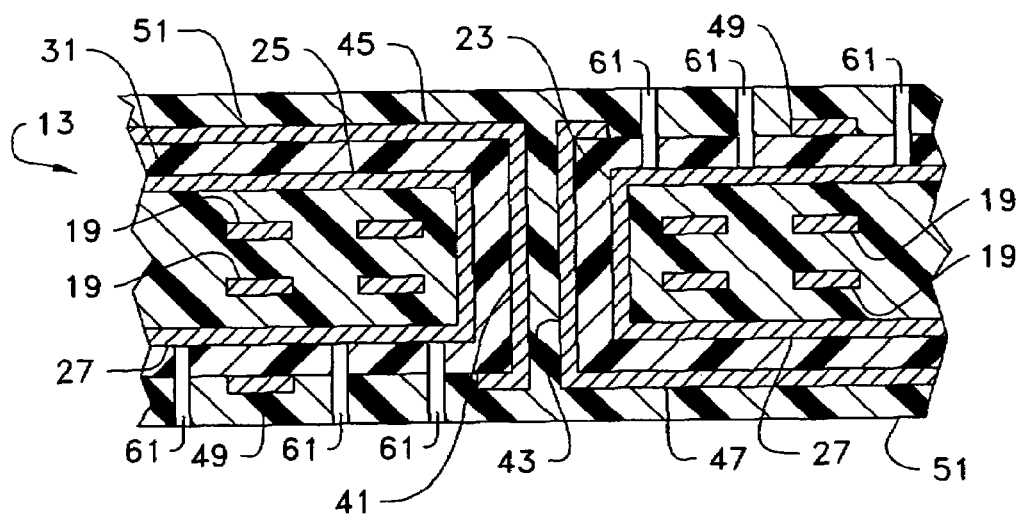

In FIG. 8, there is shown the formation of vertical grooves 61 at strategic locations within the outer layers of material 51 and, significantly, extending within the underlying material 31 to the underlying solid conductor layers 25 and 27. As seen, two grooves are formed on opposite sides of each external conductor 49, and, two others (the innermost ones in FIG. 8) formed adjacent the end conductors of opening 41. Formation of grooves 61 is preferably accomplished using laser ablation, but may be achieved mechanically. Should laser ablation be used, a UV (ultra-violet), e.g., a frequency-tripled Nd:YAG laser operating at a wavelength of about 355 nanometers, is preferably used. Each groove may possess a width of two mils and a depth of eight mils (the thickness of both layers of material 31 and 51). Each groove extends linearly within the drawing the same distance or more of the corresponding conductor signal line 49, or, in the case of those adjacent opening 41, in a substantially annular manner to substantially encircle the adjacent extending end portions of opening 41. The innermost grooves are only shown in cross section in FIG. 8 and thus not in this annular configuration but such configuration is readily understandable from this description and that of openings 21 and 41 provided above.

Figure 9:
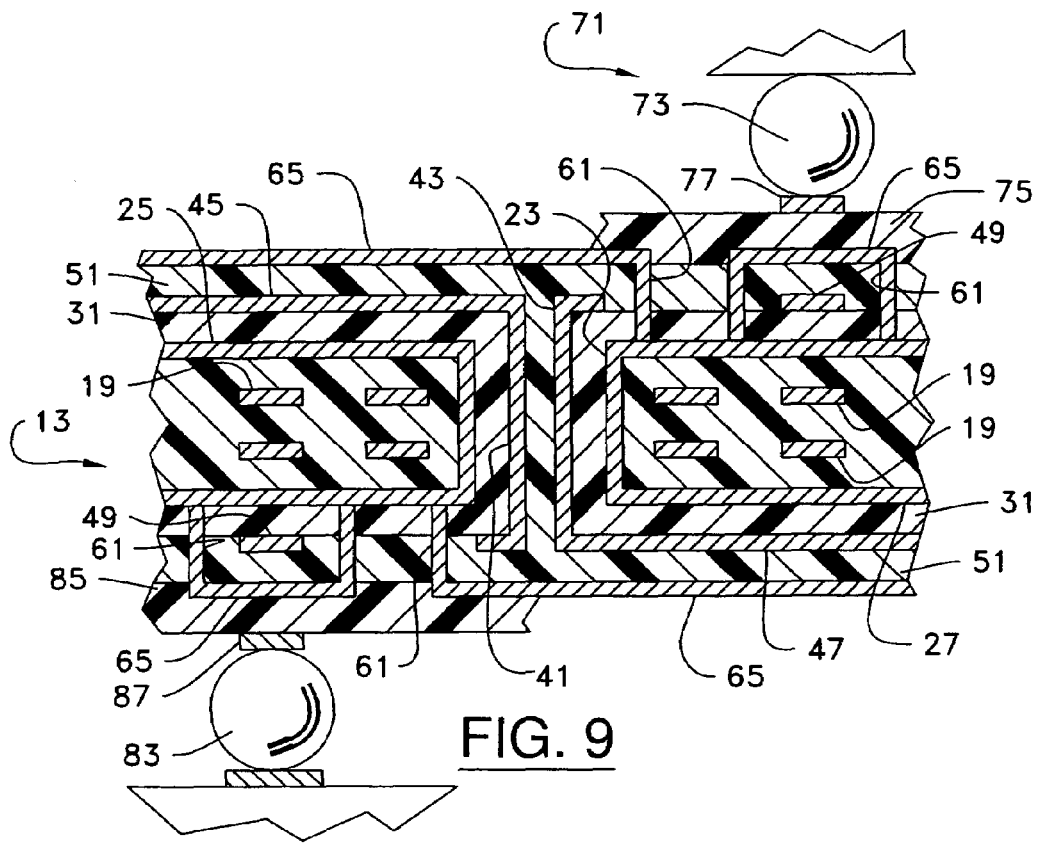

In FIG. 9, there is shown a final step in making the circuitized substrate according to one embodiment of this invention. The substrate as formed and shown in FIG. 8 is now provided with conductive layers 65 on its outer surfaces as a result of a metallization process, the preferred one being a conventional electroplating (more preferably, electrolytic or electro-less) process. Significantly, the metallurgy (preferably copper or copper alloy) also fills the formed grooves 61. The result, as seen, is that the conductors 49 are now substantially totally surrounded by metal, as are substantially all of the conductor layers 45, including the ends of the thru-hole 41. It is thus seen that all of the signal conductors (19, 49 and the thru-hole 41 and its connected layers 45) are thus shielded when high frequency and other signals are passed therethrough/there-along. This is a significant aspect of the invention because it assures that the operating circuitized substrate will exhibit significantly reduced signal noise and signal loss. As defined herein, multiples of signal conductors (i.e., 19) may be protected, as well as single signal conductors (49). Equally significant, the invention provides shielding protection for cylindrical thru-holes, several of which are typically employed in many of today's PCB and chip carrier designs and which are typically perpendicular in orientation relative to the planar layers of signal conductors. In the particular embodiment shown in FIG. 9, the shielding metal layers/members are preferably ground layers/members, electrically coupled to ground in the final operating structure. Although not limited thereto, the teachings of this invention are readily adaptable to waveguides and, as understood, assure that such waveguides will be adequately shielded. In the case of the cylindrical thru-hole and surrounding metal members, the waveguide is a coaxial one.

As mentioned above, the circuitized substrates produced in accordance with the teachings herein may function as PCBs or chip carriers. If as a PCB, the substrate is adapted for having an electrical component 71 positioned thereon and electrically coupled thereto. Component 71 may be a semiconductor chip or even a chip carrier. Coupling is possible using external conductors 73 (one shown in FIG. 9, and described in greater detail below). To accomplish this, a separate dielectric layer 75 and conductors 77 (one shown) may be added, using conventional PCB methodology. Alternatively, it is possible to couple component 71 directly to one or more of the signal conductors defined above, e.g., using conventional thru-hole methodology. In FIG. 9, conductor 77 may in turn be coupled to one or more of the internal signal conductors, e.g., using a thru-hole (e.g., a "blind via"). If the substrate of FIG. 9 is to function as a chip carrier, then it is possible to couple it to another substrate such as a PCB (the structure shown below connector 83), i.e., using an external dielectric layer 85, conductors 87 (one shown) and conductors 83 (one shown), as were provided for component 71. One known example of such a chip carrier adaptable for using the teachings herein is one known as a HyperBGA chip carrier produced and sold by the Assignee of the invention. (HyperBGA is a trademark of the Assignee, Endicott Interconnect Technologies, Inc.) In one example, external conductors 73 and 83 are preferably solder balls, e.g., those containing 63:37 tin:lead "eutectic" solder alloy or 90:10 tin:lead alloy. A total of about 3600 pads (and solder balls) may be used in one example of the invention (another example of the high density construction the invention is able to attain).

The circuitized substrate and electrical component coupled thereto as shown in FIG. 9 can thus be referred to as an electrical assembly. Likewise, the substrate (including having a chip or chips coupled thereto) and the underlying supporting substrate (a PCB) may also be referred to as an electrical assembly.

In one embodiment of the invention, the circuitized substrate of FIG. 9 may simply comprise what may be referred to as a "core" structure, which may then be combined with other similar core structures and/or other dielectric and conductive layers to form a larger, multilayered structure (e.g., a PCB). Such a "core" is thus "stacked" up with such other layers, preferably using conventional lamination processing known in the PCB art.

Figure 10:
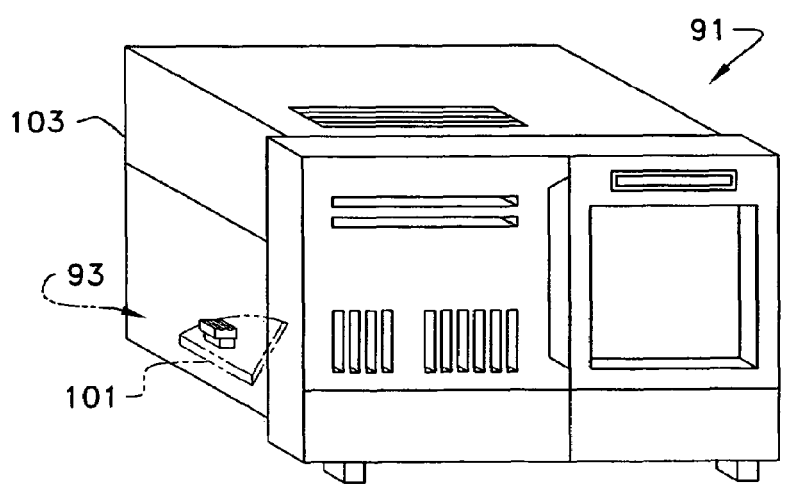
FIG. 10 illustrates an information handling system adapted for having one or more of the circuitized substrates (and electrical assemblies including same) positioned therein which form part of the system's functioning circuit structure.

In FIG. 10, there is shown an information handling system 91 according to one aspect of the invention. System 91 may comprise a computer, server, mainframe or other large information processing structure and, as shown, may include at least one circuitized substrate of the invention as part thereof, including when such a circuitized substrate is part of an electrical assembly as defined above. Several such assemblies (and substrates) can be utilized in each system, depending on the operational requirements thereof. For illustration purposes, system 91 is shown to include one assembly 93 (in phantom), the substrate thereof represented by the numeral 101. System 91 includes a conventional housing 103, with assembly 93 and substrate 101 positioned therein (using known assembly processes). Substrate 101 may comprise the "motherboard" of the system with other substrates coupled thereto. Such a system is thus able to provide high speed and shielded signals in a manner not known previously.

There has thus been shown and described a circuitized substrate construction which significantly reduces signal noise and signal loss, in addition to other features discernible from the teachings herein. The invention is able to do so by providing effective shielding of the substrate's signal conductors, while still assuring high density circuitry often mandated by today's technology. This represents a significant advancement in the art, particularly considering that the structure as produced herein may be manufactured using conventional PCB technologies, thus representing a substantially reduced cost product to the end purchaser.

While there have been shown and described what are at present the preferred embodiments of the invention, it will be obvious to those skilled in the art that various changes and modifications may be made therein without departing from the scope of the invention as defined by the appended claims.

What is claimed is:

1. A circuitized substrate comprising:

a dielectric member;

a plurality of signal conductors spacedly positioned within said dielectric member;

at least one conductive thru-hole having at least two ends and disposed within said dielectric member and extending substantially between at least two of said signal conductors; and a plurality of shielding members forming a solid, conductive wall and strategically positioned within said dielectric member so as to substantially entirely surround said plurality of signal conductors including said at least two of said signal conductors between which said at least one conductive thru-hole extends, said solid wall of said plurality of shielding members providing shielding for high frequency signals passing through said plurality of signal conductors and said at least one conductive thru-hole during operation of said circuitized substrate, whereby said at least one conductive thru-hole is shielded along the entire length and said at least two ends thereof.

2. The circuitized substrate of claim 1 wherein said dielectric member is comprised of at least one layer of a dielectric material selected from the group consisting of fiberglass-reinforced epoxy resins, polytetrafluoroethylene, polyimides, polyamides, cyanate resins, photo-imageable materials, and combinations thereof.

3. The circuitized substrate of claim 1 wherein selected ones of said plurality of signal conductors are comprised of copper or copper alloy.

4. The circuitized substrate of claim 1 wherein selected ones of said plurality of shielding members are each a solid member of conductive material.

5. The circuitized substrate of claim 4 wherein said selected ones of said plurality of shielding members are comprised of copper or copper alloy.

6. The circuitized substrate of claim 4 wherein selected ones of said selected ones of said plurality of shielding members each comprising said solid member of conductive material are substantially parallel or perpendicular to corresponding ones of said plurality of signal conductors.

7. The circuitized substrate of claim 6 wherein other selected ones of said selected ones of said plurality of shielding members each comprising said solid member of conductive material are substantially cylindrical.

8. The circuitized substrate of claim 4 wherein selected ones of said shielding members each comprising said solid member of conductive material are ground layers.

9. The circuitized substrate of claim 1 wherein said plurality of signal conductors spacedly positioned within said dielectric member occupy at least three planes within said dielectric member, said dielectric member including at least four layers of dielectric material, said planes of said signal conductors and said layers of said dielectric material being positioned within an alternating orientation.

10. The circuitized substrate of claim 1 further including at least one electrical component positioned on said circuitized substrate and electrically coupled to at least one of said signal conductors, said circuitized substrate and said at least one electrical component comprising an electrical assembly.

11. The circuitized substrate of claim 10 further including a housing, said electrical assembly positioned within said housing, said housing and said electrical assembly comprising an information handling system.

12. A method of making a circuitized substrate, said method comprising:
providing a dielectric member;
spacedly positioning a plurality of signal conductors within said dielectric member;
forming at least one conductive thru-hole having at least two ends and disposed within said dielectric member extending substantially between at least two of said signal conductors; and
forming a plurality of shielding members forming a solid, conductive wall and within said dielectric member substantially entirely surrounding said plurality of signal conductors including said at least two of said signal conductors between which said at least one conductive thru-hole extends, said solid wall of said plurality of shielding members providing shielding for high frequency signals passing through said plurality of signal conductors and said at least one conductive thru-hole during operation of said circuitized substrate.

13. The method of claim 12 wherein said plurality of signal conductors are formed using photolithographic processing.

14. The method of claim 12 wherein said forming of said at least one conductive thru-hole within said dielectric member extending substantially between at least two of said signal conductors comprises forming an opening within said dielectric member and thereafter plating the interior walls of said opening with conductive material.

15. The method of claim 12 wherein said forming of said plurality of shielding members within said dielectric member substantially entirely surrounding said plurality of signal conductors including said at least two of said signal conductors between which said at least one conductive thru-hole extends comprises forming a plurality of substantially solid members in spaced orientation to said plurality of signal conductors.

16. The method of claim 15 wherein selected ones of said plurality of substantially solid members in spaced orientation to selected ones of said plurality of signal conductors are formed substantially parallel and perpendicular to said selected ones of said plurality of signal conductors.

17. The method of claim 16 wherein other selected ones of said plurality of substantially solid members in spaced orientation to other selected ones of said plurality of signal conductors are formed of substantially cylindrical configuration.

18. The method of claim 12 wherein said plurality of signal conductors spacedly positioned within said dielectric member are formed to occupy at least three planes within said dielectric member, and said dielectric member is formed to include at least four layers of dielectric material, said planes of said signal conductors and said layers of said dielectric material being formed in an alternating orientation.

19. The method of claim 12 further including positioning at least one electrical component on said circuitized substrate and electrically coupling said at least one electrical component to at least one of said signal conductors to form an electrical assembly.

20. The method of claim 19 further including providing a housing and positioning said electrical assembly within said housing to form an information handling system.

* * * * *